(12) United States Patent
Kim et al.

(10) Patent No.: US 12,406,947 B2
(45) Date of Patent: Sep. 2, 2025

(54) SELF-ERASABLE AND REWRITABLE OPTOEXCITONIC PLATFORM FOR ANTI-TAMPER HARDWARE

(71) Applicant: THE REGENTS OF THE UNIVERSITY OF MICHIGAN, Ann Arbor, MI (US)

(72) Inventors: Jinsang Kim, Ann Arbor, MI (US); Parag Deotare, Ann Arbor, MI (US); Da Seul Yang, Ann Arbor, MI (US); Che-Hsuan Cheng, Ann Arbor, MI (US)

(73) Assignee: The Regents of The University of Michigan, Ann Arbor, MI (US)

( * ) Notice: Subject to any disclaimer, the term of this patent is extended or adjusted under 35 U.S.C. 154(b) by 214 days.

(21) Appl. No.: 18/200,019

(22) Filed: May 22, 2023

(65) Prior Publication Data
US 2023/0299020 A1    Sep. 21, 2023

Related U.S. Application Data

(62) Division of application No. 17/471,799, filed on Sep. 10, 2021, now abandoned.

(60) Provisional application No. 63/077,291, filed on Sep. 11, 2020.

(51) Int. Cl.
*H01L 23/00* (2006.01)

(52) U.S. Cl.
CPC .................................. *H01L 23/573* (2013.01)

(58) Field of Classification Search
CPC ...... H01L 23/57; H01L 23/573; H01L 23/576
See application file for complete search history.

(56) References Cited

U.S. PATENT DOCUMENTS

2018/0337300 A1*   11/2018   Lee .................... H10N 10/8556

OTHER PUBLICATIONS

Cheng, Che-Hsuan & Yang, Da & Kim, Jinsang & Deotare, Parag. (2020). Self-Erasable and Rewritable Optoexcitonic Platform for Antitamper Hardware. Advanced Optical Materials. 8. 10.1002 with Supplement, 27 pages.

* cited by examiner

*Primary Examiner* — Jesse Y Miyoshi
(74) *Attorney, Agent, or Firm* — Harness, Dickey & Pierce, P.L.C.

(57) ABSTRACT

An anti-tamper module includes a substrate and a photoisomerization (PI) layer formed on the substrate. The PI layer comprises molecules configured to transition from a first state to a second state in response to exposure to a first type of light and transition from the second state to the first state in response to exposure to a second type of light, and transitioning a selected portion of the PI layer to the first state while surrounding portions of the PI layer remain in the second state causes physical deformation of the PI layer. An excitonic layer is arranged on the PI layer. An electrical characteristic of the excitonic layer is sensitive to strain caused by the physical deformation of the PI layer such that an excitonic property of the excitonic layer changes in a region corresponding to the selected portion of the PI layer.

14 Claims, 6 Drawing Sheets

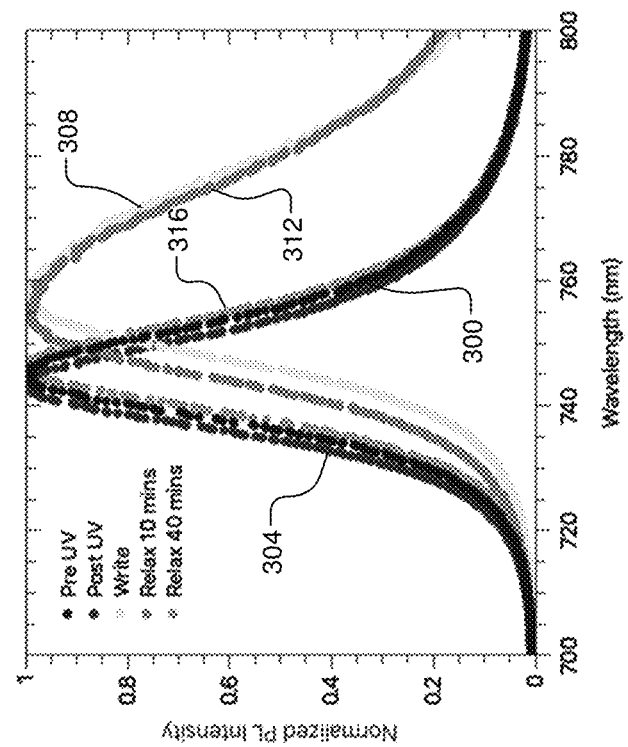
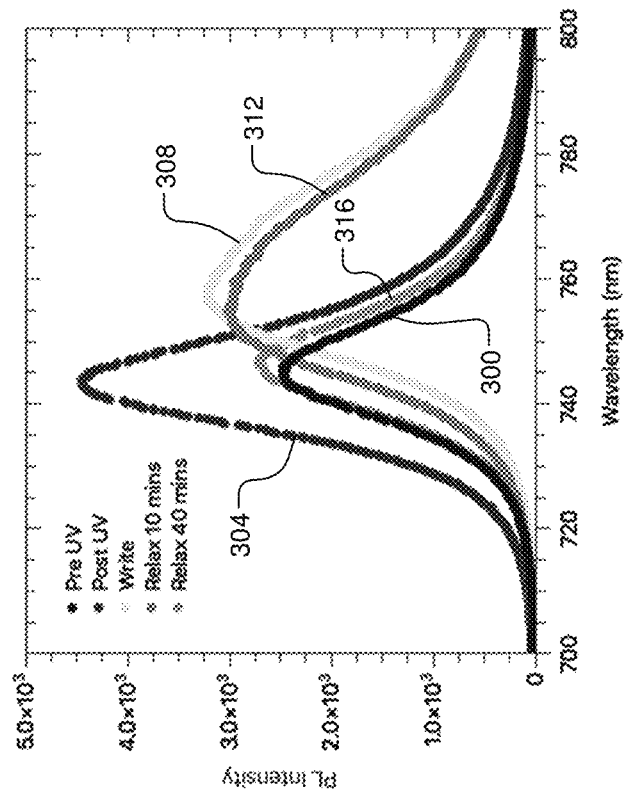
FIG. 3

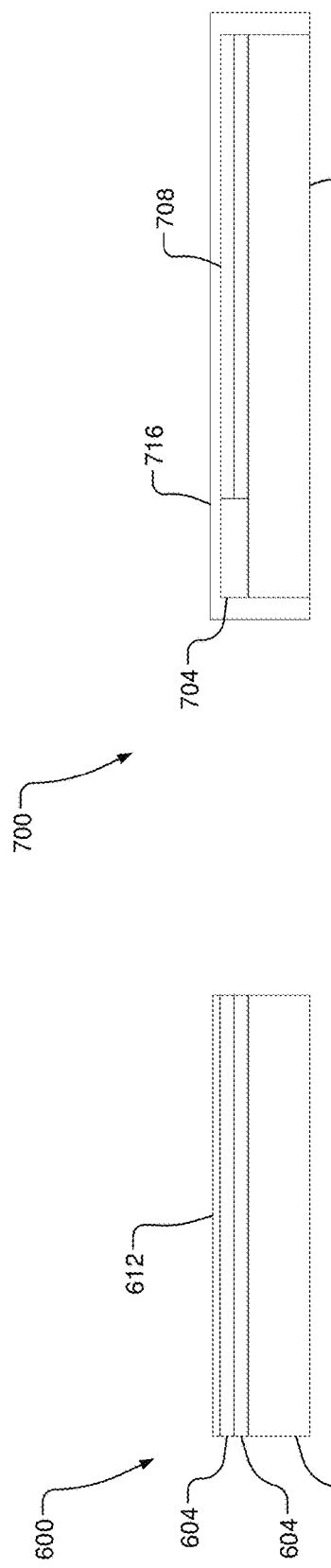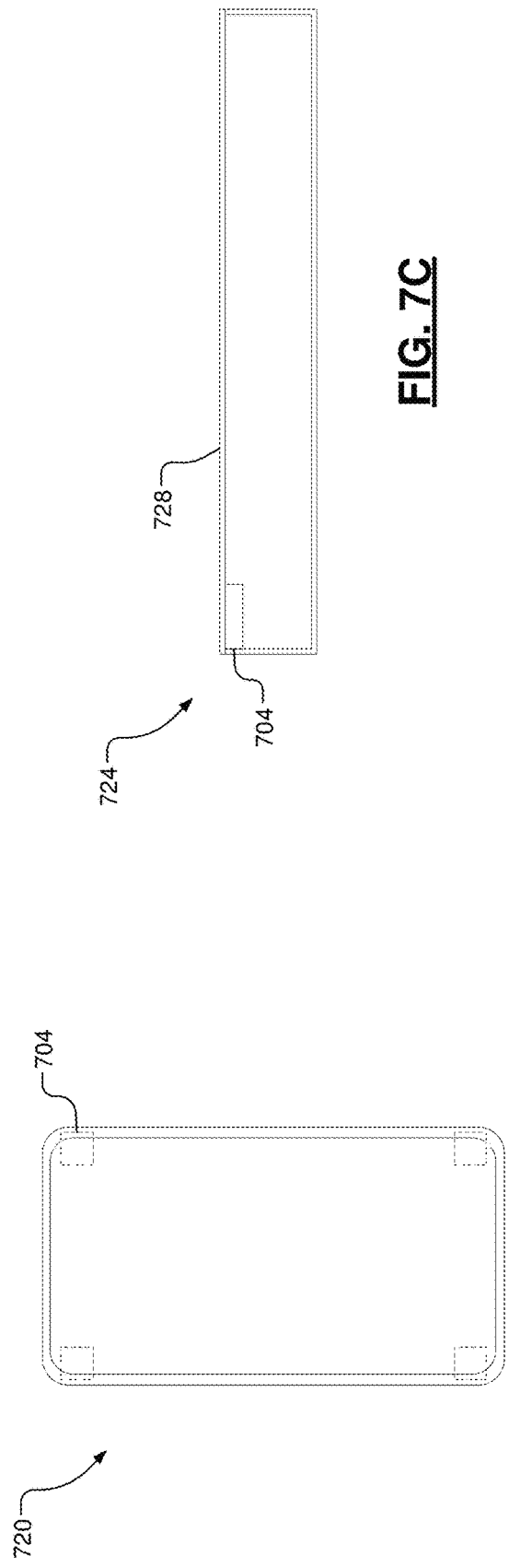

SELF-ERASABLE AND REWRITABLE OPTOEXCITONIC PLATFORM FOR ANTI-TAMPER HARDWARE

CROSS-REFERENCE TO RELATED APPLICATIONS

This application claims the benefit of U.S. patent application Ser. No. 17/471,799, filed on Sep. 10, 2021, which claims the benefit of U.S. Provisional Application No. 63/077,291, filed on Sep. 11, 2021. The entire disclosures of the applications referenced above are incorporated herein by reference.

GOVERNMENT CLAUSE

This invention was made with government support under FA9550-17-1-0208 awarded by the U.S. Air Force Office of Scientific Research. The government has certain rights in the invention.

FIELD

The present disclosure relates to optically rewritable semiconductor materials for anti-tamper, security, and other rewriteable platform applications.

BACKGROUND

Devices (e.g., including both electronic and non-electronic devices), containers (e.g., packages, shipping containers, etc.), and/or other hardware apparatuses may implement anti-tamper technology. In some examples, anti-tamper technology may include a physical barrier or device that is physically altered, broken, or otherwise damaged when a device is opened. In other examples, anti-tamper technology may be configured to render a device inoperable in response to unauthorized access or operation. Anti-tamper technology may include electronic, mechanical, and/or software implementations.

SUMMARY

An anti-tamper module includes a substrate and a photoisomerization (PI) layer formed on the substrate. The PI layer comprises molecules configured to transition from a first state to a second state in response to exposure to a first type of light and transition from the second state to the first state in response to exposure to a second type of light, and transitioning a selected portion of the PI layer to the first state while surrounding portions of the PI layer remain in the second state causes physical deformation of the PI layer. An excitonic layer is arranged on the PI layer. An electrical/optical characteristic of the excitonic layer is sensitive to strain caused by the physical deformation of the PI layer such that an excitonic property of the excitonic layer changes in a region corresponding to the selected portion of the PI layer.

In other features, the PI layer comprises an azobenzene-based molecule. The PI layer comprises one of a diarylethene-based molecule and a spiropyran-based molecule. The electrical characteristic of the excitonic layer is a band gap and the excitonic property is photoluminescence. In some examples, the excitonic property is photo absorption, lifetime, intensity, etc. The band gap of the excitonic layer shifts 25 meV~100 meV in response to a strain of 1%~2% caused by the physical deformation of the PI layer.

In other features, the excitonic layer is comprised of a transition metal dichalcogenide material. The excitonic layer is comprised of tungsten diselenide. The excitonic layer has a thickness less than ten nm. The excitonic layer is a monolayer. The PI layer is a monolayer. The PI layer includes multiple layers.

In other features, a semiconductor device includes the anti-tamper module. An electronic device includes the anti-tamper module. A container includes the anti-tamper module.

A method includes forming a photoisomerization (PI) layer on a substrate. The PI layer includes molecules configured to transition from a first state to a second state in response to exposure to a first type of light and transition from the second state to the first state in response to exposure to a second type of light, and transitioning a selected portion of the PI layer to the first state while surrounding portions of the PI layer remain in the second state causes physical deformation of the PI layer. The method includes arranging an excitonic layer on the PI layer. An electrical characteristic of the excitonic layer is sensitive to strain caused by the physical deformation of the PI layer such that excitonic property of the excitonic layer changes in a region corresponding to the selected portion of the PI layer.

In other features, the PI layer includes one of an azobenzene-based molecule, a diarylethene-based molecule, and a spiropyran-based molecule. The electrical characteristic of the excitonic layer is a band gap, the excitonic property is photoluminescence, and the band gap of the excitonic layer shifts 25 meV~100 meV in response to a strain of 1%~2% caused by the physical deformation of the PI layer. The excitonic layer is comprised of a transition metal dichalcogenide material. The excitonic layer is comprised of tungsten diselenide.

In other features, the method further includes exposing the PI layer to the first type of light to transition the molecules of the PI layer from the first state to the second state and exposing selected portions of the PI layer to the second type of light to transition the molecules of the PI layer in the selected portions from the second state to the first state.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 3 shows the photoluminescence (PL) spectrum of each step of FIG. 2 and the PL spectral shift caused by strain in the WSe2 monolayer;

FIG. 6 is an example anti-tamper module according to the present disclosure;

FIG. 7A is an example semiconductor device including an anti-tamper module 704 according to the present disclosure;

FIG. 7B is an example electronic device including an anti-tamper module according to the present disclosure;

FIG. 7C is an example package or container including an anti-tamper module according to the present disclosure.

In the drawings, reference numbers may be reused to identify similar and/or identical elements.

DETAILED DESCRIPTION

Figure 1:
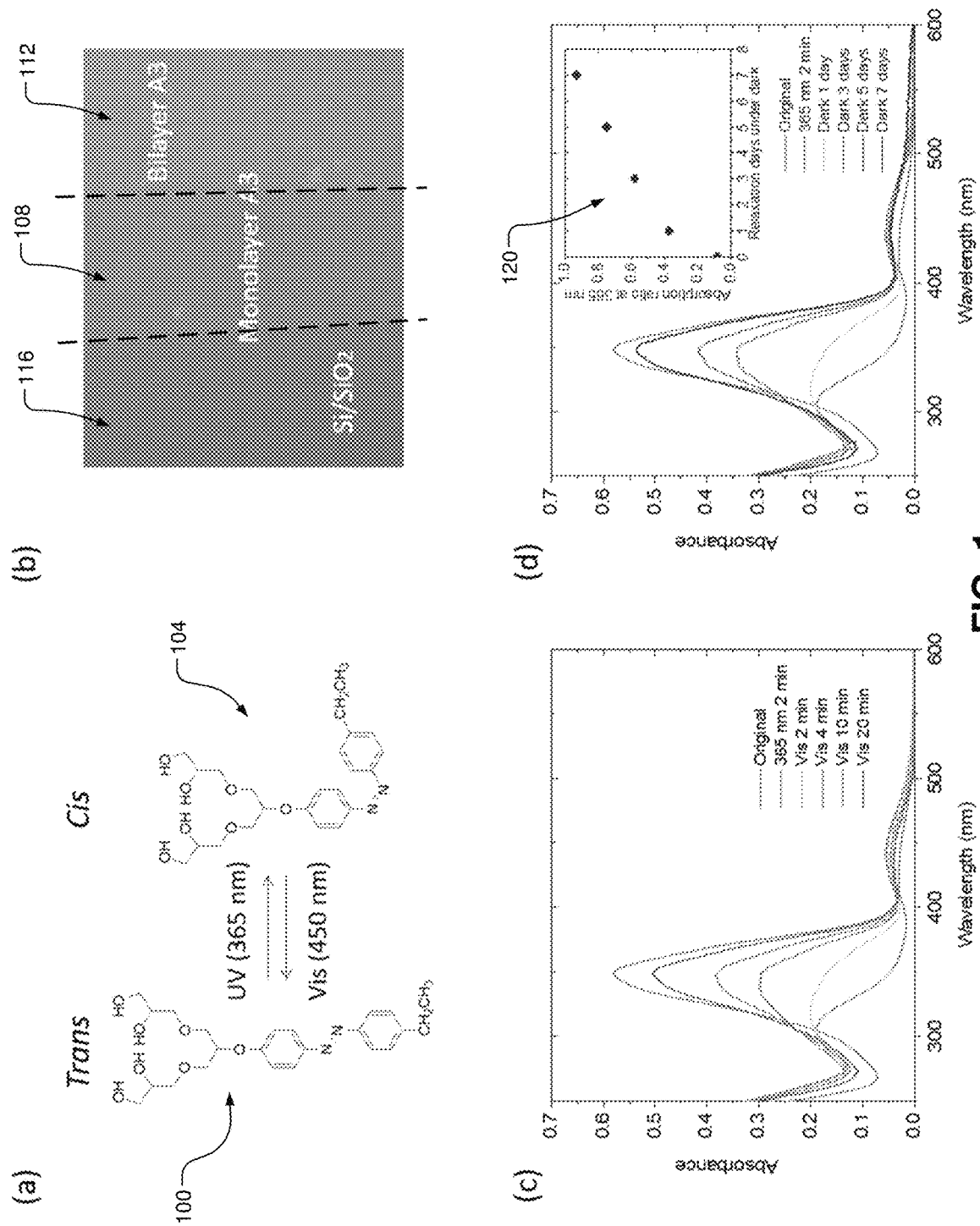
FIG. 1 shows photoisomerization of azobenzene (A3) films under visible light and in a dark environment at room temperature.

With the expansion of data processing and communication technologies, the ability to reverse engineer and/or duplicate proprietary products (e.g., using methods including, but not limited to, nanofabrication and metrology) has also expanded, resulting in significant economic and intellectual property losses. Products susceptible to tampering (e.g., integrated circuits at risk of counterfeiting and other tampering) introduce security vulnerabilities to associated systems. Accordingly, some systems may have strict requirements for anti-tamper mechanisms configured to prevent tampering and/or detect the possibility of tampering with secured devices and communications.

Different applications may have different anti-tamper requirements. In some examples, products may be required to be authenticated over a predetermined period of time without determining which component in a system was tampered with and/or when the tampering occurred. In other examples, systems may be required to provide an information transcription indicating the specific component tampered with and when the tampering occurred. The predetermined period may be long-term (e.g., a lifetime of a product) or short-term (e.g., during transportation between locations or individuals, during a predetermined usage period, etc.). Long-term authentication may include a one-time writing event followed by multiple read cycles. Conversely, short-term authentication may require rewritable storage or memory configured to self-erase subsequent to a predetermined period. Systems and methods according to the principles of the present disclosure implement an anti-tamper module configured to self-erase over time (e.g., after seven or more days) and in response to exposure to environmental conditions such as heat and/or visible light as described below in more detail. Although described with respect to anti-tamper uses, the principles of the present disclosure may be implemented in other rewriteable platform applications.

In this work we utilize nanoscale strain engineering to create a self-erasable and rewritable platform for anti-tamper hardware. The reversible structural change between trans and cis isomers in azobenzene (A3) molecules is utilized to strain the overlying tungsten diselenide (WSe2) monolayer, thereby affecting its optical bandgap. Using such hybrid material combination we generate large (e.g., >1%) local effective strain that results in dramatic shift (e.g., >11 nm) in photoluminescence wavelength. The strain in layered A3 films can be rapidly relaxed under exposure to visible light or can be retained up to seven days under dark condition. Thus, by utilizing hyperspectral imaging, we demonstrate a self-erasable and rewritable optoexcitonic platform that responds to environmental changes (light/temperature) to detect tampering of hardware system. In addition, the results open avenues for varied applications in information storage, such as time sensitive self-destructive memories that are also sensitive to light detection.

Optical and, more particularly, excitonic techniques that are based on optical transitions in semiconductors present an attractive solution for short-term authenticity. The present disclosure demonstrates a new technique based on excitons that can be used to sense environmental changes in temperature/light to detect hardware tampering. In conjunction with organic molecules based on azobenzene that undergo structural change under exposure to light, an optically rewritable scratch pad utilizes strain engineering on an overlying tungsten diselenide (WSe2) monolayer to alter the optical bandgap, thereby changing the excitonic emission wavelength. Transition metal dichalcogenides (TMDs) that support room temperature excitons may be used for strain engineering due to having a high sensitivity of bandgap to strain. Band gap shift in tungsten diselenide (WSe2) may occur in the range of 25 meV~100 meV (10 nm~40 nm) for 1%~2% of strain, and thus is one example semiconductor material usable in an anti-tamper module according to the principles of the present disclosure. The optical readout technique presented in the present disclosure enables multiple fast and remote readouts and thus is ideal for short term anti-tamper hardware.

Azobenzene (A3) is a photoisomerizing molecule that can be efficiently and reversibly switched between two structurally different forms upon exposure to different wavelengths of light and, as such, may be used for constructing light-powered molecular machines. These molecules are typically synthesized and studied in solution and have been used to induce conformational chemical changes in bound guest molecules or to synthesize other, smaller molecules, among other applications. At equilibrium in the dark, azobenzene exists in the more stable trans conformation. Irradiation with ultraviolet (UV) light (300-400 nm) produces the cis isomer, which can revert back to the trans isomer thermally or upon irradiation with blue light (400-500 nm). Azobenzene compounds have been used for optical control of conformation in diverse applications such as a photoswitch to detect the change in the structure and function of biomolecular targets, and in strain engineering to tune the mechanical properties in low dimensional materials.

In the present disclosure, a compact self-erasable and rewritable optoexcitonic platform uses monolayer WSe2 on top of thin layers of an azobenzene based molecule (e.g., (E)-3,3'-((2-(4-((4-ethylphenyl)diazenyl)phenoxy)propane-1,3-diyl)bis(oxy))bis(propane-1,2-diol), or (A3)). Molecular structures of trans state and cis isomers are shown in FIG. 1(a). Local strain is induced in monolayer WSe2 by photoactivating underlying A3 molecules with irradiation of UV light, followed by selective exposure to visible light that reversibly switches the molecules between trans and cis state. The resulting strain in monolayer WSe2 shifts the optical bandgap thereby causing a spectral shift in the photoluminescence signal. The strain can be instantaneously released by exposure to visible light or gradually over a period of time due to thermal relaxation.

FIGS. 1(a), (b), (c), and (d) show photoisomerization of A3 films under visible light and in a dark environment at room temperature. FIG. 1(a) shows chemical structures of A3 in trans and cis states at 100 and 104, respectively. The thermally stable trans isomer (9 Angstroms) can be switched to cis isomer (5.5 Angstroms) upon UV irradiation, and reverted back gradually with visible light. The thermally stable trans azobenzene isomer undergoes structural change to cis isomer upon irradiation of UV light, resulting in reduction of molecular length from 0.9 nm to 0.55 nm. The reverse transformation is gradual at ambient environment conditions but can be expedited by intense visible light irradiation or heat. We note that, the reaction of cis state to trans state is a much slower process as compared to the reverse reaction. This is partially due to the relative high absorption strength of trans isomer in UV regime than cis isomer in visible regime and the spectral intensities of the light sources used in the experiments.

FIG. 1(b) shows an optical micrograph of a monolayer A3 film 108 and a bilayer A3 film 112 on a Si/SiO$_2$ substrate 116. The A3 films 108 and 112 are prepared using a Langmuir-Blodgett (LB) method. The A3 molecule is highly polarized with a hydrophobic head and a hydrophilic tail, and as a result uniform layers of A3 can be achieved through specified treatments. The A3 thin film isomerization dynamics can be monitored over time using UV-Vis spectroscopy at room temperature.

FIG. 1(c) shows UV-Vis absorption evolution of A3 film (e.g., 6 layers of A3 films, ~5.4 nm) after UV treatment and visible light relaxation. The UV-Vis absorption evolution is shown on cover glass following UV irradiation under visible light relaxation (e.g., using a halogen lamp with an average fluence of 120 µJ/cm$^2$).

FIG. 1(d) shows UV-Vis absorption evolution of the same A3 film in a dark environment. As shown, 99% of the molecules remain in the cis state within the first 120 minutes as compared to less than 1% when exposed to visible light. Further, only 20% of the molecules relax back to the trans state after 24 hours. The inset at 120 in FIG. 1(d) shows the percentage of cis A3 molecules relaxing back to the trans state over time. As shown, 95% of the A3 molecules relaxed back to trans state after 7 days in a dark environment. Accordingly, a message engraved on such an optoexcitonic platform would automatically disappear in approximately 7 days.

Figure 2:
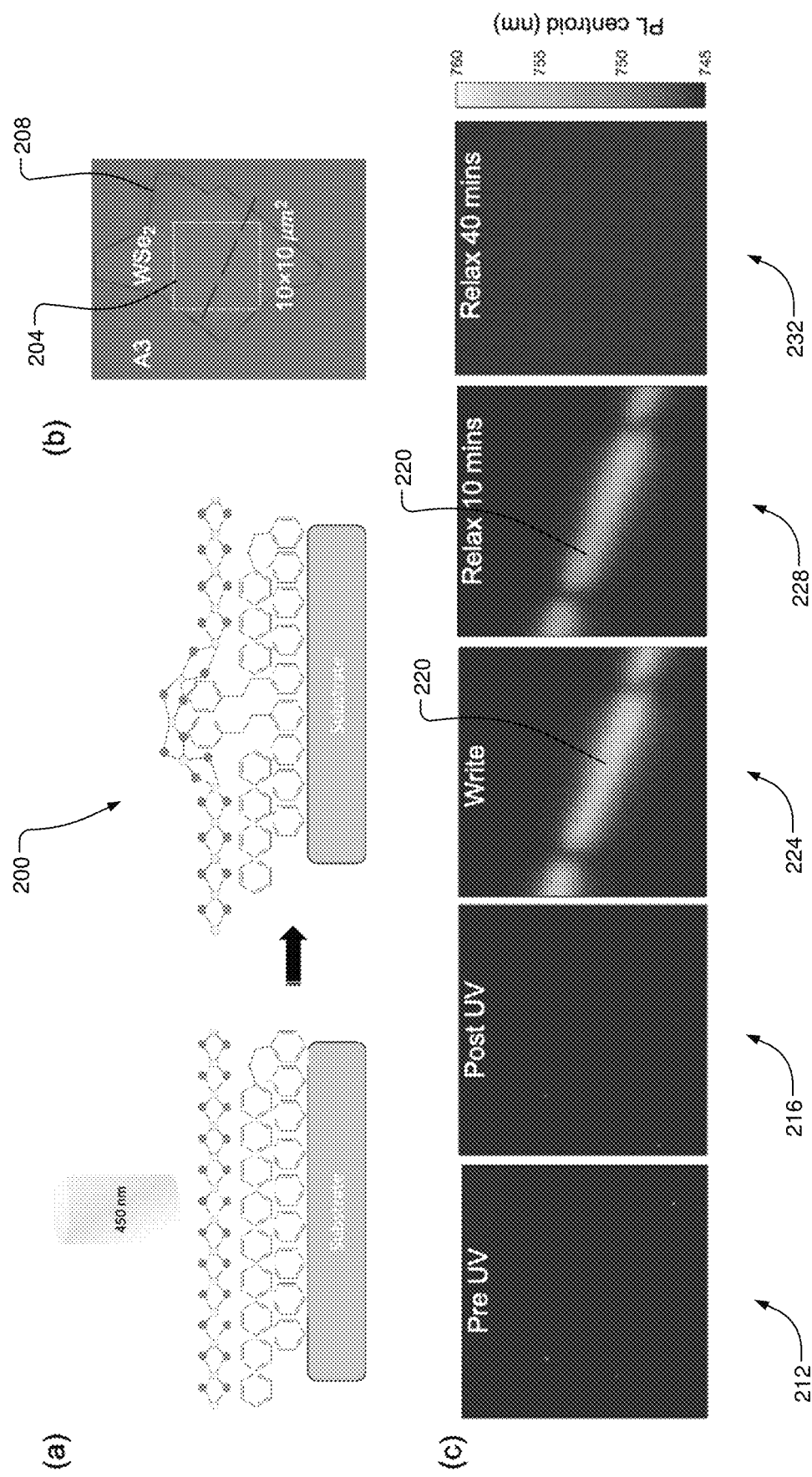
FIG. 2 shows A3-initiated strain engineering on a WSe2 monolayer.

Samples may be prepared by first transferring a mechanically exfoliated monolayer WSe2 on top of bilayer A3 films. The samples are then irradiated with 365 nm UV light (e.g., with an average fluence of 100 µW/cm$^2$) for 5 minutes to completely convert the underlying A3 bilayer to the cis state. A 450 nm laser is then used to achieve targeted relaxation of some of the molecules as cis A3 molecules shows higher absorption at this wavelength among the visible spectrum. FIG. 2 shows A3-initiated strain engineering on a WSe2 monolayer. The WSe2 monolayer is transferred on top of bilayer A3 films and the photoemission property of the WSe2 monolayer is monitored. Partially reverting some of the underlying cis molecules back to the trans state using a 450 nm laser causes selective relaxation that creates local strain on the overlying WSe2 monolayer as shown at 200 in FIG. 2(a). The strain is visualized by conducting a sequence of a photoluminescence (PL) spectral centroid map of the sample using a 532 nm excitation laser. The induced strain in monolayer WSe2 is translated into PL spectral shift. For example, a redshift of 11 nm that corresponds to 1.1% of tensile strain is observed. A brightfield image of the strain is shown in FIG. 2(b). A square region 204 (10×10 µm$^2$) represents the scanned area for monitoring the PL shift. A region surrounded by a line 208 indicates the linear profile scanned by the 450 nm laser during the write cycle.

A sequence of a PL spectral centroid map of the square region 204 is shown in FIG. 2(c) where strained regions are mapped to show a red shift in energy to indicate tensile strain. The strained regions are red shifted in energy due to tensile strain generated on the monolayer during the process. The PL centroid map shows the initializing of the film using UV followed by the write cycle and the relaxing phase. The sample is shown pre-exposure to UV at 212 (a pre-UV step). The sample is irradiated with UV light (e.g., for 5 minutes), where the complete underlying A3 bilayer undergoes trans to cis transformation that results in zero spectral shift in the PL spectrum as shown at 216 (i.e., post-exposure to UV; a post-UV step). The exposure to UV is followed by a write cycle (a write step), where a 450 nm laser (e.g., a spot size of 2 µm, fluence of 25 µJ/cm$^2$) is linearly scanned (as a dashed line 220) to partially relax some molecules back to the trans state to create the local strain as shown at 224 (and shown schematically at 200).

The sample is then exposed to white light to initiate relaxation. Information is partially erased after 10 minutes of exposure to white light as shown at 228 (10 minute relax step). All of the information is erased after longer exposure to white light. For example, as shown at 232, all of the information is erased after ~40 minutes of exposure to white light (40 minute relax step).

FIG. 3 shows the PL spectrum of each step of FIG. 2(c) and the PL spectral shift caused by strain in the WSe2 monolayer. The spectra were taken at the center of the dashed line 220 in FIG. 2(c) for each step. FIG. 3(a) shows the non-normalized PL spectrum of each step and FIG. 3(b) shows the normalized PL spectrum of each step. Measurements taken at the pre-UV, post-UV, write, 10 minute relax, and 40 minute relax steps are shown at 300, 304, 308, 312, and 316, respectively. A red shift of 12 nm corresponding to 1.1% of tensile strain in the writing phase is observed. The PL red shift gradually disappears after the relaxation process. The intensity drop at the strain area is caused by the direct to indirect transition of the optical band gap in the TMD monolayer.

The observed PL intensity drop and broader linewidth after the write cycle (creation of local strain) may be caused by contributions from the inhomogeneous broadening over the strained area as well as direct-to-indirect transition of the optical band gap of the TMD monolayer under high strain. The observed red shift of 11 nm translates to a very high effective tensile strain value of 1.1%. The effective strain created by just 2 layers of A3 molecules (0.7 nm in isomerized length change) is significantly higher when compared to other reported studies that used mechanical setups to induce strain on TMDs. Further, the PL intensity enhances from the pre-UV (trans state) to the post-UV (cis state) phase, and vice versa. This phenomenon is associated with doping in TMD materials. Azobenzene based molecules in the trans state may also provide pathways for doping while the photoisomerization from trans to cis configuration weakens such pathways. In some examples, the lowering emission intensity of the WSe2 monolayer by trans A3 molecules indicates p-doping where neutral excitons are suppressed by excess positive trions, which is confirmed by the electric current-voltage transfer characterization.

Figure 4:
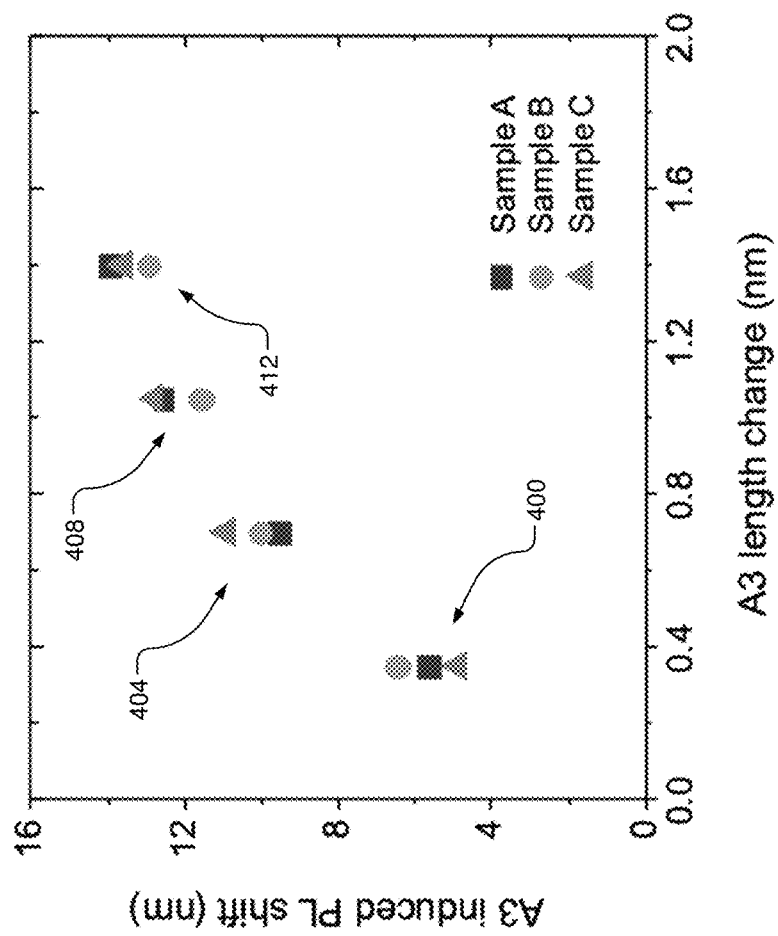
FIG. 4 shows a comparison of the strain induced by A3 films having different layers.

To further quantify the strain relationship with the underlying layer, we transfer the WSe2 monolayer onto 1, 2, 3, and 4 layers of A3 films and induce local point strain using the method described above. FIG. 4 compares the strain induced by A3 films having the different layers (with 3 samples for each layer). The samples of the strain for A3 films of 1, 2, 3, and 4 layers are shown at 400, 404, 408, and 412, respectively. The thickness of each layer switches from 0.9 nm (trans state) to 0.55 nm (cis state) or vice versa upon UV or white light treatment. A 0.7 nm height difference (bilayer) on the film produces an average of 9.5 nm PL red shift (1% tensile strain) on the WSe2 monolayer. The induced strain that is translated to PL shift increases with A3 film thickness.

In other words, the strain created on the WSe2 monolayer is dependent on the thickness change of A3 films caused by photoisomerization. Further, as shown in FIG. 4, the PL shift increase starts to saturate for 3 and 4 layers of A3 films. This observation also confirms that the molecules in each deposited layer of A3 undergo photoisomerization. However, the increase in PL shift with number of layers appears to asymptote for higher number of A3 layers, possibly due to inability of A3 molecules to fully stretch with increased layers, thereby reducing the effective strain on the monolayer. Nevertheless, a maximum effective strain of 1.4% using four layers of A3 molecules can be achieved.

Figure 5:
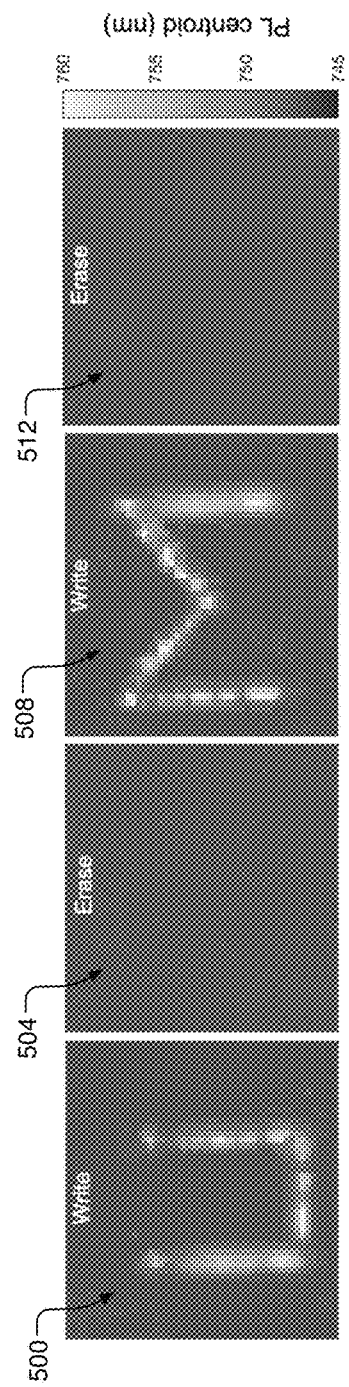
FIG. 5 shows an example of sequentially write and erase cycles of monolayer WSe2 with underlying bilayer A3.
Figure 8:
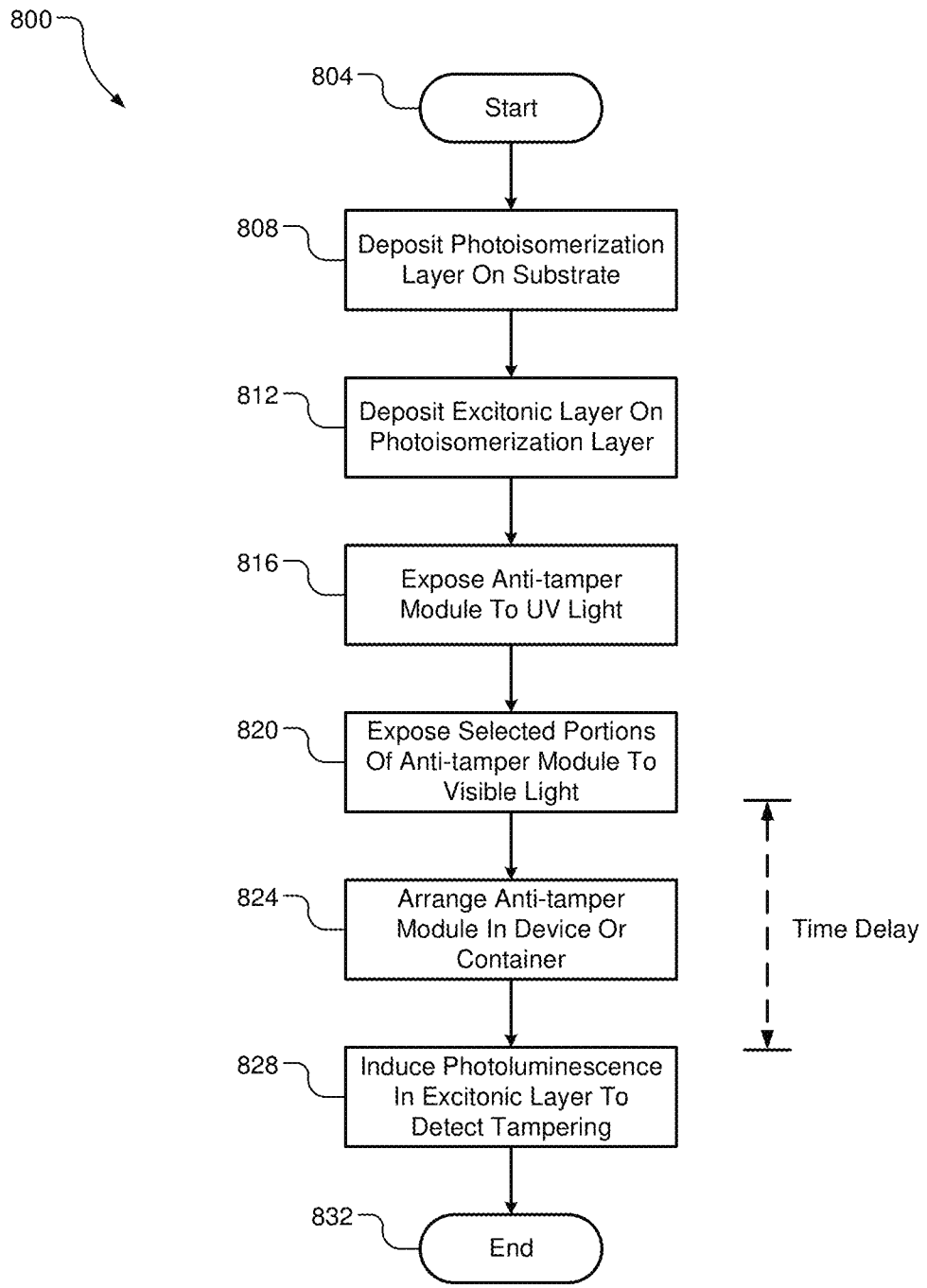
FIG. 8 illustrates steps of an example method of forming and using an anti-tamper module according to the present disclosure.

The ability to reversibly modulate the optical bandgap of monolayer WSe2 by up to 1.4% can be utilized to develop an optoexcitonic platform for an anti-tamper hardware system where the information is erased due to change in environmental conditions (such as opening the system and allowing exposure to light). FIG. 5 shows an example where letters U and M are sequentially written and erased on a 20 µm×20 µm square region of monolayer WSe2 with underlying bilayer A3. Letters are defined using a 450 nm laser (spot size ~2 µm) with 2 µm pixel pitch and are erased using white light irradiation. The letter U is written at 500 and erased after 40 minutes of white light relaxation as shown at 504. The letter M is written at 508 and erased after 40 minutes of white light relaxation as shown at 512. Accordingly, the repeatability of writing and erasing process over multiple samples is shown. Such a platform can also be used to create self-destructible messages where critical information is erased at the end of a predetermined expiration period.

As described above, a potential anti-tamper hardware platform can be implemented based on strain engineering excitonic properties of monolayer WSe2 using underlying thin layers of A3 molecules. The induced tensile strain can be controlled using a layer by layer approach and an effective tensile strain as high as 1.4% for 4 layers of A3 molecules can be achieved. The self-erasable and rewritable optoexcitonic platform may be applied in self-destructible memory and anti-tamper hardware with A3 films optimized for faster and more sensitive response. Such an optoexcitonic platform can further benefit applications such as self-destruction of sensitive data over time, optical scratch pads, sensitive light detectors, etc.

Referring now to FIG. 6, an example anti-tamper module 600 according to the present disclosure is shown. Although described with respect to anti-tamper functionality, the anti-tamper module 600 may also be configured to function as self-erasing memory (i.e., to perform self-destruction of sensitive data over time). The anti-tamper module 600 includes one or more photoisomerization (PI) layers 604 formed on a substrate 608. The substrate 608 may be comprised of an inorganic material, such as silicon, silicon dioxide ($SiO_2$), etc. As shown, two of the PI layers 604 (e.g., two monolayers) are formed on the substrate 608. For example only, the PI layers 604 may comprise one or more monolayers, bilayers, etc.

The PI layers 604 are comprised of molecules (e.g., organic molecules) configured to reversibly (i.e., temporarily) transition between different states in response to exposure to light or heat. The transition between the different states (e.g., a trans isomer state and a cis isomer state) may be localized (e.g., in response to targeted UV light) to induce local strain in the PI layers 604. In other words, exposure to some types of light (e.g., UV light) causes a transition from the trans isomer state to the cis isomer state and physical deformation of the PI layers 604, while exposure to other types of light (e.g., visible, ambient light) causes a transition from the cis isomer state to the trans isomer state and corresponding relaxation of the PI layers 604. The transition from the cis isomer state to the trans isomer state also occurs over time without exposure to visible light (e.g., in a dark environment absent of exposure to light).

In some examples, the PI layers 604 are comprised of azobenzene (A3)-based molecules. In other examples, the PI layers 604 may be comprised of other molecules that transition between trans and cis isomer states in the manner described above. Other example PI molecules include, but are not limited to, diarylethene-based molecules and spiropyran-based molecules.

A semiconductor excitonic layer 612 is formed on the PI layers 604. The excitonic layer 612 is comprised of a material having an electrical characteristic (e.g., bandgap) that is sensitive to relatively small amounts of physical strain caused by deformation of the PI layers 604. In some examples, sensitivity to strain may correspond to a detectable band gap shift of 10 meV~200 meV in response to strain corresponding to physical deformation of less than 5%. For example, the excitonic layer 612 is comprised of a transition metal dichalcogenide (TMD) such as tungsten diselenide (WSe2) having a band gap shift in the range of 25 meV~100 meV (10 nm 40 nm) for 1%~2% of strain. The excitonic layer 612 is thin (e.g., between 1-10 atoms thick) to maximize localized movement in the excitonic layer 612 in response to local strain induced in the PI layers 604. Although described as comprising WSe2, in other examples the excitonic layer 612 may comprise other materials with excitonic properties of the kind described herein. For example, the excitonic layer 612 may be comprised of one more materials including, but not limited to inorganic semiconductors such as transition metal dichalcogenides that include tungsten or molybdenum as well as organic semiconductors such as Alq3, DCM, tetracene, etc. or the various combinations.

The change in band gap of the excitonic layer 612 causes a detectable change in an excitonic property of the excitonic layer 612, such as an excitonic emission wavelength (e.g., a spectral shift in photoluminescence). The shift in photoluminescence may be detected by exciting or irradiating the excitonic layer 612 (e.g., with an excitation laser) and monitoring the resulting photoluminescence of the excitonic layer 612 as described above in FIGS. 2-5. Other excitonic properties that may be changed by the strain and/or the change in band gap and subsequently detected include, but are not limited to, photo absorption, lifetime, intensity, etc.

Referring now to FIG. 7A, an example semiconductor device 700 including an anti-tamper module 704 according to the present disclosure is shown. For example, the semiconductor device 700 is an integrated circuit (IC) including one or more electronic circuits in addition to the anti-tamper module 704. As one example, the anti-tamper module 704 is a chip, circuit, circuit package, etc. arranged on an IC, within an IC, on a same printed circuit board as an IC, etc. The semiconductor device 700 includes one or more semiconductor or other layers 708 formed on a substrate 712. The anti-tamper module 704 may be formed on a same or different substrate as the semiconductor layers 708. The semiconductor device 700 is enclosed in a packaging material (e.g., a resin or plastic) 716 to form an IC package. Although only one of the anti-tamper modules 704 is shown, two or more of the anti-tamper modules 704 may be arranged in different locations within the semiconductor device 700.

An upper surface of the anti-tamper module 704 may be coplanar with or above an upper surface of an uppermost layer of the semiconductor layers 708. Accordingly, if the packaging material 716 is removed from an upper portion of the semiconductor device 700 to expose the semiconductor layers 708, the upper surface of the anti-tamper module 704 (corresponding to the excitonic layer) is exposed to light. In some examples, multiple surfaces (e.g., an upper surface, side surfaces, and a lower surface) of the anti-tamper module 704 may include a corresponding PI layer and excitonic layer such that exposure to light from multiple directions is possible.

Referring now to FIG. 7B, one or more of the anti-tamper modules 704 may be implemented in an example electronic device 720 (e.g., a smartphone, laptop computer, tablet, etc.). The anti-tamper modules 704 may be provided as a distributed array and/or in locations of the electronic device 720 susceptible to tampering. Similarly, as shown in FIG. 7C, one or more of the anti-tamper modules 704 may be implemented in a package or container 724. For example, the container 724 is a shipping container including a lid 728 and the anti-tamper module 704 is arranged proximate the lid. Accordingly, opening the container 724 by removing the lid 728 exposes the anti-tamper module 704 to ambient light. In other examples, the anti-tamper module 704 may be implemented in "soft" packages (e.g., by arranging the anti-tamper module 704 within an envelope, between a flap and body of the envelope, etc.).

An example method 800 of forming and using an anti-tamper module according to the present disclosure starts at 804. At 808, a PI layer (e.g., a layer comprising an A3-based molecule as described above) is deposited or formed on a substrate. For example, the PI layer is formed using atomic layer deposition, chemical vapor deposition, etc. At 812, an excitonic layer (e.g., monolayer WSe2) is deposited or formed on the PI layer. For example, the excitonic layer is pre-fabricated and then transferred onto the PI layer. In other examples, the excitonic layer is formed on the PI layer using atomic layer deposition or another semiconductor deposition process. Although described above as one example fabrication process, other suitable fabrication processes may be used to form and assemble the anti-tamper module according to the present disclosure.

At 816, the anti-tamper module is exposed to UV light to transition the PI layer from a trans isomer state to a cis isomer state. Although UV light is provided as one example range of light wavelengths applied to the PI layer, other ranges of light wavelengths may be used. For example, depending on the composition of the PI layer, the PI layer may be responsive to different light wavelengths, including different types of visible and nonvisible light. Accordingly, at 816, the anti-tamper module may be exposed to light having a wavelength within a predetermined range in accordance with a known configuration of the PI layer.

At 820, selected portions of the PI layer are exposed to visible light to transition the selected portions from the cis isomer state to the trans isomer state and induce local strain in the PI layer. For example, the selected portion may correspond to an encoded message, a symbol or character, an alphanumeric string, etc. The local strain induced in the PI layer is transferred to the excitonic layer and is detectable in accordance with a PL shift in the excitonic layer. In examples where the anti-tamper module is implemented as a self-erasable message or memory, the anti-tamper module may be simply stored or transferred between parties after step 820 and the message corresponding to the selected portion may be readable for a predetermined period of time (e.g., 7 days).

At 824, the anti-tamper module is arranged in a device or container (e.g., a semiconductor device, an electronic device, a shipping container, etc.). Although as shown the anti-tamper module is arranged in the device subsequent to exposing the anti-tamper module to UV light and visible light at 816 and 820, respectively, in some examples the anti-tamper module 824 can be arranged in the device prior to step 816, between steps 816 and 820, etc.

At 828, after a time delay but prior to expiration of a predetermined period in which the anti-tamper module completely self-erases (i.e., completely reverts from the cis isomer state to the trans isomer state in a dark environment), the anti-tamper module is observed to determine whether any tampering with the device occurred. The time delay may correspond to a transportation period, a lending period, or any other period where the device was exposed to possible tampering. For example, the anti-tamper module is removed from the device (e.g., in a dark environment) and irradiated to induce photoluminescence in the excitonic layer. The photoluminescence is indicative of whether the anti-tamper module was exposed to visible light (and, correspondingly, exposed to tampering) as described above. The method 800 ends at 832.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A method for detecting tampering with an electronic device, comprising:
    forming a photoisomerization (PI) layer, where the PI layer comprises molecules configured to physically deform in response to external stimuli;
    forming an excitonic layer on the PI layer to form an anti-tampering module, where the excitonic layer is comprised of material that exhibit excitonic properties and the anti-tampering module is arranged inside an electronic device;
    changing optical band gap of the excitonic layer in select regions thereof by physically deforming select regions of the PI layer such that select regions of the excitonic layer are adjacent to select regions of PI layer; and
    inducing photoluminescence from the excitonic layer after the step of changing the optical band gap; and
    monitoring the photoluminescence from the excitonic layer, thereby detecting tampering with the electronic device.

2. The method of claim 1 wherein the select regions of the PI layer are physically deforming by exposing the select regions of the PI layer to ultraviolet radiation.

3. The method of claim 1 further comprises inducing change in photoluminescence energy from the excitonic layer after the step of changing the optical band gap.

4. The method of claim 1 wherein the PI layer is comprised azobenzene-based molecules.

5. The method of claim 1 wherein the excitonic layer is comprised of a transition metal dichalcogenide material or an organic semiconductor.

6. The method of claim 1 wherein the excitonic layer is comprised of tungsten diselenide.

7. The method of claim 1, wherein the excitonic layer has a thickness less than ten nm.

8. A method for detecting tampering with an electronic device, comprising:

forming a photoisomerization (PI) layer, where the PI layer comprises molecules configured to physically deform in response to external stimuli;

forming an excitonic layer on the PI layer to form an anti-tampering module, where the excitonic layer is comprised of material that exhibit excitonic properties and the anti-tampering module is arranged inside an electronic device; and straining select regions of the excitonic layer by physically deforming select regions of the PI layer such that select regions of the excitonic layer are adjacent to select regions of PI layer;

inducing photoluminescence from the excitonic layer after the step of straining select regions of the excitonic layer; and monitoring the photoluminescence from the excitonic layer, thereby detecting tampering with the electronic device.

9. The method of claim 8 wherein the select regions of the PI layer are physically deforming select regions by exposing the select regions of the PI layer to ultraviolet radiation.

10. The method of claim 8 further comprises inducing photoluminescence from the excitonic layer after the step of changing the optical band gap.

11. The method of claim 8 wherein the PI layer is comprised azobenzene-based molecules.

12. The method of claim 8 wherein the excitonic layer is comprised of a transition metal dichalcogenide material or an organic semiconductor.

13. The method of claim 8 wherein the excitonic layer is comprised of tungsten diselenide.

14. The method of claim 8, wherein the excitonic layer has a thickness less than ten nm.

* * * * *